United States Patent
Takami

(10) Patent No.: US 7,597,729 B2
(45) Date of Patent: Oct. 6, 2009

(54) POLISHING COMPOSITION AND POLISHING METHOD USING THE SAME

(75) Inventor: Shinichiro Takami, Kakamigahara (JP)

(73) Assignee: Fujimi Incorporated, Kiyosu-shi, Aichi (JP)

( * ) Notice: Subject to any disclaimer, the term of this patent is extended or adjusted under 35 U.S.C. 154(b) by 0 days.

(21) Appl. No.: 11/823,606

(22) Filed: Jun. 28, 2007

(65) Prior Publication Data

US 2007/0256368 A1    Nov. 8, 2007

Related U.S. Application Data

(62) Division of application No. 11/250,103, filed on Oct. 13, 2005, now abandoned.

(30) Foreign Application Priority Data

Oct. 15, 2004   (JP)   ............... 2004-300873

(51) Int. Cl.
*B24B 1/00*   (2006.01)
*C09G 1/02*   (2006.01)
*C09G 1/04*   (2006.01)
*H01L 21/302*   (2006.01)
*H01L 21/304*   (2006.01)

(52) U.S. Cl. ............... 51/308; 51/307; 51/309; 106/3; 106/5; 438/691; 438/692; 438/693; 257/E21.23

(58) Field of Classification Search ............... 106/3, 106/5; 51/307–309; 438/690–694; 257/E21.23
See application file for complete search history.

(56) References Cited

U.S. PATENT DOCUMENTS

| 6,280,652 | B1 | 8/2001 | Inoue et al. | ............. 252/79.1 |
| 6,312,487 | B1 * | 11/2001 | Tanaka | ............. 51/309 |
| 6,565,619 | B1 | 5/2003 | Asano et al. | ............. 51/308 |
| 2003/0051413 | A1 | 3/2003 | Sakai et al. | |
| 2003/0234184 | A1 | 12/2003 | Liu et al. | ............. 205/680 |
| 2004/0108302 | A1 * | 6/2004 | Liu et al. | ............. 216/83 |
| 2004/0127046 | A1 | 7/2004 | Takami | ............. 438/690 |
| 2004/0229461 | A1 | 11/2004 | Darsillo et al. | ............. 438/689 |
| 2005/0236601 | A1 | 10/2005 | Liu et al. | ............. 252/79.1 |
| 2006/0049143 | A1 | 3/2006 | Sakamoto | ............. 216/89 |

FOREIGN PATENT DOCUMENTS

| CN | 1398939 A1 | 2/2003 |
| EP | 1 229 093 | 8/2002 |
| EP | 1 279 708 | 1/2003 |
| EP | 1881524 A1 | 1/2008 |
| GB | 2419134 A | 4/2006 |
| JP | 11-349925 | 12/1999 |
| JP | 2004-128069 | 4/2004 |
| WO | WO 20061009641 A1 | 1/2006 |

* cited by examiner

*Primary Examiner*—Michael A Marcheschi
(74) *Attorney, Agent, or Firm*—Vidas, Arrett & Steinkraus, P.A.

(57) ABSTRACT

A polishing composition contains an abrasive such as colloidal silica, at least one kind of compound selected from imidazole and an imidazole derivative, and water. The polishing composition preferably further contains an alkali compound, a water-soluble polymer, or a chelating agent. The polishing composition is suitable for use in polishing an edge of an object such as a semiconductor substrate.

9 Claims, No Drawings

POLISHING COMPOSITION AND POLISHING METHOD USING THE SAME

CROSS-REFERENCE TO RELATED APPLICATIONS

This application is a Divisional application from Ser. No. 11/250,103, which is now abandoned, filed Oct. 13, 2005 the contents of which is hereby incorporated by reference.

BACKGROUND OF THE INVENTION

The present invention relates to a polishing composition for use in polishing an edge of an object such as semiconductor substrates, and to a method for polishing an edge of an object such as semiconductor substrates using such a polishing composition.

Polishing compositions for use in polishing edges of semiconductor substrates, that is, a polishing composition for polishing edges are disclosed in Japanese Laid-Open Patent Publications No. 11-349925 and No. 2004-128069. In polishing of the edges of the semiconductor substrates, it is desired that the time required for polishing be short and high-quality semiconductor substrates be obtained that have only a small number of surface defects such as scratches as in polishing of the surfaces of the semiconductor substrates. The polishing compositions disclosed in the above publications No. 11-349925 and No. 2004-128069 have been improved to respond to such requirements. However, the polishing composition of the above publications does not sufficiently satisfy the requirements and there is yet room for improvements in the polishing composition.

SUMMARY OF THE INVENTION

Accordingly, it is an objective of the present invention to provide a polishing composition more suitable for use in polishing an edge of an object such as semiconductor substrates, and to provide a method for polishing an edge of an object such as semiconductor substrates using the polishing composition.

To achieve the foregoing and other objectives and in accordance with the purpose of the present invention, a polishing composition for use in polishing an edge of an object is provided. The polishing composition includes an abrasive, at least one kind of compound selected from imidazole and an imidazole derivative, and water.

The present invention also provides a method including polishing an edge of an object using the above polishing composition.

The present invention also provides a method for manufacturing a polished product. The method includes: preparing the above polishing composition; and polishing an edge of a semi-finished product of the polished product using the prepared polishing composition.

Other aspects and advantages of the invention will become apparent from the following description illustrating by way of example the principles of the invention.

DETAILED DESCRIPTION OF THE PREFERRED EMBODIMENTS

One embodiment of the present invention will now be described.

A polishing composition according to this embodiment contains an abrasive, imidazole or an imidazole derivative, and water.

The abrasive plays the role of mechanically polishing an object. The abrasive preferably contains silicon dioxide, and more preferably is silicon dioxide. Silicon dioxide has superior performance in polishing the object smoothly. Silicon dioxide may be any of colloidal silica, fumed silica, and precipitated silica, and preferably is colloidal silica. The object polished using a polishing composition containing colloidal silica has less surface defects such as scratches as compared to the object polished using a polishing composition containing silicon dioxide other than colloidal silica.

An abrasive having too small an average particle size is not so high in ability to polish an object. In view of accelerating polishing of the object with an abrasive, the average particle size of the abrasive in the polishing composition obtained from the specific surface area of the abrasive measured through a BET method is preferably 10 nm or more, and more preferably 30 nm or more, and most preferably 50 nm or more. Meanwhile, when an abrasive has too large an average particle size, there is a risk of generating scratches on the object. In view of suppressing formation of scratches, the average particle size of the abrasive in the polishing composition obtained from the specific surface area of the abrasive measured through the BET method is preferably 200 nm or less, and more preferably 120 nm or less, and most preferably 80 nm or less.

A polishing composition containing too small an amount of an abrasive is not so high in polishing ability. In view of ensuring an improvement in polishing ability of the polishing composition, the content of the abrasive in the polishing composition is preferably 0.1% by mass or more, and more preferably 1.0% by mass or more, and most preferably 10.0% by mass or more. Meanwhile, when the polishing composition contains a large amount of an abrasive, there is a risk of excessively increasing the viscosity of the polishing composition. In view of optimizing the viscosity of the polishing composition, the content of the abrasive in the polishing composition is preferably 50.0% by mass or less.

The imidazole and the imidazole derivative in the polishing composition contribute to an improvement of the polishing ability of the polishing composition. The reason why the imidazole and the imidazole derivative contribute to an improvement of the polishing ability is considered to be that the unshared electron pair of the nitrogen atom at the 1-position of the imidazole ring directly acts on the object. Furthermore, the imidazole and the imidazole derivative have a small risk of corroding the object unlike other amines such as monoethanolamine, or 1,8-diazabicyclo(5,4,0)-undecene-7 (abbrev. DBU), and 1,5-diazabicyclo(4,3,0)-nonene-5 (abbrev. DBN).

The imidazole derivative may be one in which, for example, at least one of hydrogen atoms bonded to the nitrogen atom at the 1-position, the carbon atom at the 2-position, the carbon atom at the 4-position, and the carbon atom at the 5-position of the imidazole ring is substituted by an alkyl group such as a methyl group and an ethyl group, a hydroxy group, a carboxy group, or an amino group.

A polishing composition containing too small an amount of imidazole or an imidazole derivative is not so high in polishing ability. In view of ensuring an improvement in polishing ability of the polishing composition, the content of the imidazole or the imidazole derivative in the polishing composition is preferably 0.1% by mass or more, and more preferably 0.5% by mass or more, and most preferably 1.0% by mass or more. Meanwhile, when the polishing composition contains a large amount of imidazole or an imidazole derivative, there is a risk of roughening the surface of the polished object, since chemical corrosion of the polishing composition becomes too strong. In view of inhibiting the surface from roughening, the content of the imidazole or the imidazole derivative in the polishing composition is preferably 20.0% by mass or less, and more preferably 15.0% by mass or less, and most preferably 10.0% by mass or less.

The water serves as a medium for dispersing or dissolving components other than water in the polishing composition. Water may be industrial water, tap water, distilled water, or one obtained by filtering any of these, and preferably contains as little impurities as possible.

The polishing composition according to this embodiment is for use in, for example, polishing the edges of semiconductor substrates such as silicon wafers. In other words, the polishing composition is for use in, for example, polishing the edges of semi-finished products to obtain semiconductor substrates as polished products. The edge of the object is polished using the polishing composition, for example, by placing a polishing member such as a polishing pad in contact with the edge of the object, and sliding either the object or the polishing member while feeding the polishing composition into the contact portion.

The preferred embodiment provides the following advantages.

A polishing composition according to this embodiment contains imidazole or an imidazole derivative that contribute to an improvement of polishing ability of the polishing composition. Thus, the polishing composition of this embodiment, compared to the conventional polishing compositions, has greater polishing ability, and promptly polishes the edge of the object, or more specifically, the edges of the semiconductor substrates. The polishing composition of this embodiment is hence very useful in polishing edges of semiconductor substrates.

The imidazole and the imidazole derivative have less risk of corroding the object unlike other amines such as monoethanolamine, DBU, and DBN. Therefore, the object polished using the polishing composition of this embodiment is less corroded as compared to the object polished using the polishing composition containing other amines such as monoethanolamine, DBU, and DBN. When a semiconductor device is manufactured from a semiconductor substrate having a large amount of corroded portion, the electric characteristic of the semiconductor device decreases. However, the semiconductor substrate that is polished using the polishing composition of this embodiment is not or hardly corroded. Therefore, a semiconductor device the electric characteristic of which is suppressed from decreasing is manufactured from the semiconductor substrate.

When an oxidizing agent is added to the polishing composition of this embodiment, depending on the amount of the oxidizing agent that is added, there is a risk of forming a passivation layer on the surface of the object being polished. When the passivation layer is formed on the surface of the object, there is a risk of decreasing polishing ability of the polishing composition since polishing of the object through chemical polishing operation of the polishing composition is hindered. However, the polishing composition of this embodiment avoids a negative effect caused by an oxidizing agent since the polishing composition does not contain the oxidizing agent.

The preferred embodiment may be modified as follows.

The polishing composition of this embodiment may further contain an alkali compound. The alkali compound plays the role of chemically polishing an object, and contributes to an improvement of polishing ability of the polishing composition. The alkali compound may contain any of tetramethylammonium hydroxide, potassium hydroxide, sodium hydroxide, potassium hydrogen carbonate, potassium carbonate, sodium hydrogen carbonate, sodium carbonate, ammonia, ammonium hydrogen carbonate, and ammonium carbonate, and preferably includes at least one kind selected from the group consisting of tetramethylammonium hydroxide, potassium hydroxide, and sodium hydroxide, and more preferably includes tetramethylammonium hydroxide. Tetramethylammonium hydroxide, potassium hydroxide, and sodium hydroxide have high ability of polishing the object, and tetramethylammonium hydroxide has particularly high ability of polishing the object.

When the polishing composition contains too small an amount of an alkali compound, the polishing ability of the polishing composition does not improve much. In view of significantly improving polishing ability of the polishing composition, the content of the alkali compound in the polishing composition is preferably 0.05% by mass or more, and more preferably 0.25% by mass or more, and most preferably 0.5% by mass or more. Meanwhile, when the polishing composition contains a large amount of an alkali compound, there is a risk of roughening the surface of the polished object, since chemical corrosion of the polishing composition becomes too strong. In view of inhibiting the surface from roughening, the content of the alkali compound in the polishing composition is preferably 6.0% by mass or less, and more preferably 5.0% by mass or less, and most preferably 2.0% by mass or less.

The polishing composition of this embodiment may further contain a water-soluble polymer. The water-soluble polymer acts to improve the wettability of the object. When the object has a high wettability, even if the abrasive adheres to the object, the adhered abrasive is easily removed by simply washing.

The water-soluble polymer may include any of hydroxyethyl cellulose, polyvinyl alcohol, polyethylene oxide, and polyethylene glycol, and preferably includes hydroxyethyl cellulose. Hydroxyethyl cellulose has particularly high ability of improving the wettability of the object.

When the water-soluble polymer has too low a molecular weight, the wettability of the polished object does not improve much. As a result, there is a risk that the abrasive in the polishing composition strongly adheres to the object. In view of ensuring an improvement in the wettability of the polished object, the molecular weight of hydroxyethyl cellulose is preferably 300,000 or more, and more preferably 600,000 or more, and most preferably 900,000 or more. Likewise, the molecular weight of polyvinyl alcohol is preferably 1,000 or more, and more preferably 5,000 or more, and most preferably 10,000 or more, the molecular weight of polyethylene oxide is preferably 20,000 or more, and the molecular weight of polyethylene glycol is preferably 100 or more, and more preferably 300 or more, and most preferably 1,000 or more. Meanwhile, when the molecular weight of a water-soluble polymer is excessively high, there is a risk of excessively increasing the viscosity of the polishing composition. In view of optimizing the viscosity of the polishing composition, the molecular weight of hydroxyethyl cellulose is preferably 3,000,000 or less, and more preferably 2,000,000 or less, and most preferably 1,500,000 or less. Likewise, the molecular weight of polyvinyl alcohol is preferably 1,000,000 or less, and more preferably 500,000 or less, and most preferably 300,000 or less, the molecular weight of polyethylene oxide is preferably 50,000,000 or less, and more preferably 30,000,000 or less, and most preferably 10,000,000 or less, and the molecular weight of polyethylene glycol is preferably 20,000 or less.

When the polishing composition contains too small an amount of a water-soluble polymer, the wettability of the object does not improve much. In view of improving the wettability of the object, the content of the water-soluble polymer in the polishing composition is preferably 0.0001% by mass or more, and more preferably 0.001% by mass or more, and most preferably 0.005% by mass or more. Meanwhile, when the polishing composition contains a large amount of a water-soluble polymer, there is a risk of excessively increasing the viscosity of the polishing composition. In view of optimizing the viscosity of the polishing composition, the content of the water-soluble polymer in the polishing composition is preferably 0.5% by mass or less, and more preferably 0.3% by mass or less, and most preferably 0.15% by mass or less.

The polishing composition according to this embodiment may further contain a chelating agent. The chelating agent suppresses contamination of the object with metal impurities by forming a complex ion with metal impurities in the polishing composition thereby capturing the metal impurities. The metal impurities in this specification refer to iron, nickel, copper, calcium, magnesium, and hydroxide or oxide of the same.

The chelating agent may be any of nitrilotriacetic acid, ethylenediaminetetraacetic acid, hydroxyethylenediaminetetraacetic acid, propanediaminetetraacetic acid, diethylenetriaminepentaacetic acid, triethylenetetraminehexaacetic acid, ethylenediaminetetraethylenephosphonic acid, ethylenediaminetetramethylenephosphonic acid, ethylenediaminetetrakismethylenephosphonic acid, diethylenetriaminepentaethylenephosphonic acid, diethylenetriaminepentamethylenephosphonic acid, triethylenetetraminehexaethylenephosphonic acid, triethylenetetraminehexamethylenephosphonic acid, and propanediaminetetraethylenephosphonic acid propanediaminetetramethylenephosphonic acid, and the salt of the same, which are ammonium salt, potassium salt, sodium salt, and lithium salt.

The polishing composition containing a large amount of a chelating agent easily gelates. In view of preventing gelation, the content of the chelating agent in the polishing composition is preferably 6% by mass or less, and more preferably 3% by mass or less, and most preferably 1% by mass or less.

The polishing composition of this embodiment may contain a small amount of an oxidizing agent. When the polishing composition contains a large amount of the oxidizing agent (for example, when the content of the oxidizing agent in the polishing composition is 1% by mass or more), there is a risk of decreasing the polishing ability of the polishing composition since the passivation layer is formed on the surface of the object as described above. However, when the content of the oxidizing agent is small, the passivation layer is not formed, or only a thin passivation layer is formed that is easily removed by mechanical polishing operation of the abrasive. In view of preventing reduction of the polishing ability of the polishing composition, the content of the oxidizing agent in the polishing composition is preferably 0.1% by mass or less, and more preferably 0.01% by mass or less.

The polishing composition according to this embodiment may contain both the imidazole and the imidazole derivative.

The polishing composition according to this embodiment may be prepared by diluting liquid concentrate with water.

The polishing composition according to this embodiment may be used for polishing an edge of an object other than semiconductor substrates.

The present invention will now be described in more detail with reference to Examples and Comparative Examples.

In Examples 1 to 17, an abrasive, imidazole, and water were mixed, and to the mixture was added an alkali compound, a water-soluble polymer, or a chelating agent, if necessary, to prepare liquid concentrates of polishing compositions. In Comparative Examples 1 to 10, an abrasive and water were mixed, and to the mixture was added imidazole or its alternate compound, an alkali compound, a water-soluble polymer, a chelating agent, or an oxidizing agent, if necessary, to prepare liquid concentrates of polishing compositions. Types and contents of an abrasive, imidazole or its alternate compound, an alkali compound, a water-soluble polymer, a chelating agent, and an oxidizing agent in each liquid concentrate used in Examples 1 to 17 and Comparative Examples 1 to 10 are shown in Tables 1 and 2. Each liquid concentrate was diluted with water to ten times its volume to prepare the polishing composition used in Examples 1 to 17 and Comparative Examples 1 to 10.

An edge of a silicon wafer was polished using each polishing composition of Examples 1 to 17 and Comparative Examples 1 to 10 under a first polishing condition shown in Table 3. The difference in the weight of each silicon wafer before and after polishing, that is, the reduced weight of each silicon wafer was measured. The polishing rate obtained by dividing the measured weight reduction amount of each silicon wafer by polishing time is shown in the column entitled "Polishing rate" of Tables 1 and 2.

An edge of a silicon wafer was polished using each polishing composition of Examples 1 to 17 and Comparative Examples 1 to 10 under a second polishing condition shown in Table 3. The edge of the polished wafer was observed with a microscope. Based on how much of scratches located on the edge of the wafer before polishing has been removed, the polishing compositions were evaluated according to a five rank scale: excellent (1), good (2), acceptable (3), slightly poor (4), and poor (5). That is, when all the scratches were removed, the polishing composition was ranked excellent; when almost all the scratches were removed, the polishing composition was ranked good; when most of the scratches were removed, the polishing composition was ranked acceptable; when the scratches were not removed very much, the polishing composition was ranked slightly poor; and when the scratches were hardly removed, the polishing composition was ranked poor. The evaluation results are shown in the column entitled "Scratches" in Tables 1 and 2.

Bare silicon wafers in chips of 32 mm×32 mm having mirror finished surfaces were immersed in 2.5 mass % solution of dilute hydrofluoric acid for one minute to remove a natural oxidation film formed on the surface of each wafer. The wafers were then immersed in the polishing compositions of Examples 1 to 17 and Comparative Examples 1 to 10. After one hour, the wafers were taken out of the polishing compositions and then washed with water and dried. Subsequently, the surfaces of the wafers were visually observed. Based on how the mirror finished surface of the wafer has changed by chemical corrosion of the polishing composition, the polishing compositions were evaluated according to a five rank scale: excellent (1), good (2), acceptable (3), slightly poor (4), and poor (5). That is, when the entire surface of the wafer was maintained in a mirror-finished state, the polishing composition was ranked excellent; when large part of the surface of the wafer was maintained in a mirror-finished state, the polishing composition was ranked good; when most of the surface of the wafer is maintained in the mirror-finished state, the polishing composition was ranked acceptable; when large part of the surface of the wafer was not maintained in the mirror-finished state, the polishing composition was ranked slightly poor; and when the entire surface of the wafer was not maintained in the mirror-finished state, the polishing composition was ranked poor. The evaluation results are shown in the column entitled "Corrosiveness" in Tables 1 and 2.

TABLE 1

|  | Abrasive [mass percentage] | Imidazole [mass percentage] | Alkali compound [mass percentage] | Water-soluble polymer [mass percentage] | Chelating agent [mass percentage] | Polishing rate [mg/min.] | Scratches | Corrosiveness |
|---|---|---|---|---|---|---|---|---|
| Ex. 1 | colloidal silica*1 35.0% | imidazole 4.0% | TMAH 1.0% | HEC*1 0.008% | TTHA 0.08% | 1.45 | 1 | 2 |
| Ex. 2 | colloidal silica*1 35.0% | imidazole 1.0% | TMAH 1.0% | HEC*1 0.008% | TTHA 0.08% | 1.33 | 1 | 2 |
| Ex. 3 | colloidal silica*1 35.0% | imidazole 10.0% | TMAH 1.0% | HEC*1 0.008% | TTHA 0.08% | 1.62 | 1 | 2 |
| Ex. 4 | colloidal silica*1 35.0% | imidazole 4.0% | — | — | — | 1.40 | 2 | 1 |
| Ex. 5 | colloidal silica*1 35.0% | imidazole 4.0% | — | HEC*1 0.008% | TTHA 0.08% | 1.38 | 1 | 1 |
| Ex. 6 | colloidal silica*1 35.0% | imidazole 1.0% | — | HEC*1 0.008% | TTHA 0.08% | 1.24 | 2 | 1 |
| Ex. 7 | colloidal silica*1 35.0% | imidazole 10.0% | — | HEC*1 0.008% | TTHA 0.08% | 1.58 | 1 | 1 |
| Ex. 8 | colloidal silica*1 35.0% | imidazole 4.0% | KOH 0.5% | HEC*1 0.008% | TTHA 0.08% | 1.60 | 1 | 3 |
| Ex. 9 | colloidal silica*1 35.0% | imidazole 4.0% | NaOH 0.5% | HEC*1 0.008% | TTHA 0.08% | 1.58 | 1 | 3 |
| Ex. 10 | colloidal silica*2 35.0% | imidazole 4.0% | TMAH 1.0% | HEC*1 0.008% | TTHA 0.08% | 1.42 | 1 | 2 |
| Ex. 11 | colloidal silica*1 10.0% | imidazole 4.0% | TMAH 1.0% | HEC*1 0.008% | TTHA 0.08% | 1.15 | 2 | 2 |
| Ex. 12 | colloidal silica*1 20.0% | imidazole 4.0% | TMAH 1.0% | HEC*1 0.008% | TTHA 0.08% | 1.21 | 2 | 2 |
| Ex. 13 | colloidal silica*1 35.0% | imidazole 4.0% | TMAH 1.0% | — | TTHA 0.08% | 1.48 | 1 | 2 |
| Ex. 14 | colloidal silica*1 35.0% | imidazole 4.0% | TMAH 1.0% | HEC*2 0.008% | TTHA 0.08% | 1.38 | 1 | 2 |
| Ex. 15 | colloidal silica*1 35.0% | imidazole 4.0% | TMAH 1.0% | HEC*3 0.008% | TTHA 0.08% | 1.46 | 1 | 2 |
| Ex. 16 | colloidal silica*1 35.0% | imidazole 4.0% | TMAH 1.0% | HEC*1 0.008% | — | 1.44 | 1 | 2 |
| Ex. 17 | colloidal silica*1 35.0% | imidazole 4.0% | TMAH 1.0% | HEC*1 0.008% | DTPA 0.08% | 1.44 | 1 | 2 |

TABLE 2

|  | Abrasive [mass percentage] | Imidazole or its alternate compound [mass percentage] | Alkali compound [mass percentage] | Water-soluble polymer [mass percentage] | Chelating agent [mass percentage] | Oxidizing agent [mass percentage] | Polishing rate [mg/min.] | Scratches | Corrosiveness |
|---|---|---|---|---|---|---|---|---|---|
| C. Ex. 1 | colloidal silica*1 35.0% | — | — | — | — | — | 0.48 | 5 | 1 |
| C. Ex. 2 | colloidal silica*1 35.0% | — | TMAH 2.0% | HEC*1 0.008% | TTHA 0.08% | — | 1.25 | 4 | 2 |
| C. Ex. 3 | colloidal silica*1 35.0% | — | KOH 0.5% | HEC*1 0.008% | TTHA 0.08% | — | 0.97 | 5 | 5 |
| C. Ex. 4 | colloidal silica*1 35.0% | — | NaOH 0.5% | HEC*1 0.008% | TTHA 0.08% | — | 1.03 | 5 | 5 |
| C. Ex. 5 | colloidal silica*1 35.0% | — | piperazine 5.0% | HEC*1 0.008% | TTHA 0.08% | — | 1.20 | 5 | 4 |
| C. Ex. 6 | colloidal silica*1 35.0% | imidazole 2.5% | TMAH 1.0% | HEC*1 0.008% | TTHA 0.08% | H2O2 10.0% | 0.89 | 5 | 2 |
| C. Ex. 7 | colloidal silica*1 35.0% | DBU 2.5% | — | HEC*1 0.008% | TTHA 0.08% | — | 1.50 | 1 | 4 |
| C. Ex. 8 | colloidal silica*1 35.0% | DBU 2.5% | — | HEC*1 0.008% | TTHA 0.08% | H2O2 10.0% | 0.90 | 5 | 4 |
| C. Ex. 9 | colloidal silica*1 35.0% | DBN 2.5% | — | HEC*1 0.008% | TTHA 0.08% | — | 1.46 | 2 | 4 |
| C. Ex. 10 | colloidal silica*1 35.0% | DBN 2.5% | — | HEC*1 0.008% | TTHA 0.08% | H2O2 10.0% | 0.85 | 5 | 4 |

TABLE 3

First Polishing condition

Object to be polished: bare silicon wafer having a diameter of 8 inches (about 200 mm)
Polishing machine: "EP-150/200/300-IV NF" manufactured by SPEEDFAM Co., Ltd.
Rotation speed of drum: 1000 rpm
Polishing load: 2.0 kgf (=approx. 20N)
Polishing pad: "DRP-II" manufactured by SPEEDFAM Co., Ltd.
Inclination angle of unit: 45 degrees
Vertical speed of drum: 72 mm/minute
Rotation time of lower chuck: 60 seconds
Number of polishing: 4 times (forward/backward × front/rear)
Total polishing time: 240 seconds
Chamfering angle: 22 degrees
Feed rate of polishing composition: 200 mL/minute
Temperature of polishing composition: 20-25° C.

Second Polishing condition

Object to be polished: bare silicon wafer having a diameter of 8 inches (about 200 mm) that has been through tape polishing
Polishing machine: "EP-150/200/300-IV NF" manufactured by SPEEDFAM Co., Ltd.
Rotation speed of drum: 1000 rpm
Polishing load: 0.5 kgf (=approx. 5N)
Polishing pad: "DRP-II" manufactured by SPEEDFAM Co., Ltd.
Inclination angle of unit: 45 degrees
Vertical speed of drum: 72 mm/minute
Rotation time of lower chuck: 60 seconds
Number of polishing: 4 times (forward/backward × front/rear)
Total polishing time: 240 seconds
Chamfering angle: 22 degrees
Feed rate of polishing composition: 200 mL/minute
Temperature of polishing composition: 20-25° C.

In the column entitled "Abrasive" in Tables 1 and 2, "colloidal silica [*1]" represents colloidal silica having the average particle size of 55 nm, which is obtained from the specific surface area measured through the BET method, and "colloidal silica [*2]" represents colloidal silica having the average particle size of 35 nm, which is also obtained from the specific surface area measured through the BET method.

In the column entitled "Alkali compound" in Tables 1 and 2, "TMAH" represents tetramethylammonium hydroxide, "KOH" represents potassium hydroxide, and "NaOH" represents sodium hydroxide. In the column entitled "Water-soluble polymer" in Tables 1 and 2, "HEC [*1]" represents hydroxyethyl cellulose having an average molecular weight of 1,200,000, "HEC [*2]" represents hydroxyethyl cellulose having an average molecular weight of 300,000, and "HEC [*3]" represents hydroxyethyl cellulose having an average molecular weight of 1,600,000. In the column entitled "Chelating agent" in Tables 1 and 2, "TTHA" represents triethylenetetraminehexaacetic acid, "DTPA" represents diethylenetriaminepentaacetic acid. In the column entitled "Oxidizing agent" in Table 2, "$H_2O_2$" represents hydrogen peroxide.

As shown in Tables 1 and 2, the polishing rate measured using any of the polishing compositions of Examples 1 to 17 was generally greater than the polishing rate measured using the polishing composition of any of Comparative Examples 1 to 10. Any of the evaluations on scratches when using the polishing compositions of Examples 1 to 17 was either excellent or good. The results suggest that any polishing composition of Examples 1 to 17 has high polishing ability. The polishing rate measured using any of the polishing compositions of Examples 1 to 3 containing an alkali compound was greater than the polishing rate measured using the polishing composition of any of Examples 5 to 7 containing no alkali compound. The results suggest that polishing ability of a polishing composition is enhanced by addition of an alkali compound.

The evaluation for the corrosiveness of the polishing composition of Example 5 containing no alkali compound is superior than the evaluation for the corrosiveness of the polishing composition of Example 1 containing tetramethylammonium hydroxide as an alkali compound. Furthermore, the evaluation for the corrosiveness of the polishing composition of Example 1 is superior than the evaluation for the corrosiveness of the polishing compositions of Examples 8 and 9 containing potassium hydroxide or sodium hydroxide as an alkali compound. The results suggest that the surface roughening is caused by adding an alkali compound, and tetramethylammonium hydroxide has smaller risk of causing surface roughening as compared to potassium hydroxide and sodium hydroxide.

The invention claimed is:

1. A method comprising edge polishing a semiconductor substrate using a polishing composition containing an abrasive, at least one kind of compound selected from imidazole and an imidazole derivative, tetramethylammonium hydroxide, a water-soluble polymer, a chelating agent, and water, and containing no oxidizing agent, wherein the abrasive is contained in the polishing composition in an amount of 35.0% to 50% by mass of the polishing composition, and wherein the tetramethylammonium hydroxide is contained in the polishing composition in an amount of 1.0% to 6% by mass of the polishing composition.

2. The method according to claim 1, wherein the abrasive contains colloidal silica.

3. The method according to claim 1, wherein the average particle size of the abrasive is 10 to 200 nm.

4. The method according to claim 1, wherein the content of the at least one kind of compound selected from imidazole and an imidazole derivative in the polishing composition is 0.1 to 20.0% by mass.

5. The method according to claim 1, wherein the water-soluble polymer includes any of hydroxyethyl cellulose, polyvinyl alcohol, polyethylene oxide, and polyethylene glycol.

6. The method according to claim 1, wherein the chelating agent is any of nitrilotriacetic acid, ethylenediaminetetraacetic acid; hydroxyethylenediaminetetraacetic acid, propanediaminetetraacetic acid, diethylenetriaminepentaacetic acid, triethylenetetraminehexaacetic acid, ethylenediaminetetraethylenephosphonic acid, ethylenediaminetetramethylenephosphonic acid, ethylenediaminetetrakismethylenephosphonic acid, diethylenetriaminepentaethylenephosphonic acid, diethylenetriaminepentamethylenephosphonic acid, triethylenetetraminehexaethylenephosphonic acid, triethylenetetraminehexamethylenephosphonic acid, propanediaminetetraethylenephosphonic acid, propanediaminetetramethylenephosphonic acid, and salts thereof, which are ammonium salt, potassium salt, sodium salt, and lithium salt.

7. A method for manufacturing a semiconductor substrate, comprising:
preparing a polishing composition containing an abrasive, at least one kind of compound selected from imidazole and an imidazole derivative, tetramethylammonium hydroxide, a water-soluble polymer, a chelating agent, and water, and containing no oxidizing agent, wherein the abrasive is contained in the polishing composition in an amount of 35.0% to 50% by mass of the polishing composition, and wherein the tetramethylammonium hydroxide is contained in the polishing composition in an amount of 1.0% to 6% by mass of the polishing composition; and edge polishing a semi-finished product of the semiconductor substrate using the prepared polishing composition.

8. The method according to claim 6, wherein the chelating agent is any of diethylenetriaminepentaacetic acid, triethylenetetraminehexaacetic acid, ethylenediaminetetrakismethylenephosphonic acid, and salts thereof, which are ammonium salt, potassium salt, sodium salt and lithium salt.

9. A method comprising edge polishing a semiconductor substrate using a polishing composition containing colloidal silica with a content of 35.0% by mass of the polishing composition, imidazole with a content in a range of from 1.0 to 4.0% by mass of the polishing composition, tetramethylammonium hydroxide with a content of 1.0% by mass of the polishing composition, hydroxyethyl cellulose with a content of 0.008% by mass of the polishing composition, triethylenetetraminehexaacetic acid or diethylenetriaminepentaacetic acid with a content of 0.08% by mass of the polishing composition, and water, and containing no oxidizing agent.

* * * * *